United States Patent [19]

Burgess

[11] Patent Number: 4,711,804
[45] Date of Patent: Dec. 8, 1987

[54] CIRCUIT BOARD CONSTRUCTION

[75] Inventor: James F. Burgess, Schenectady, N.Y.

[73] Assignee: General Electric Company, Schenectady, N.Y.

[21] Appl. No.: 881,543

[22] Filed: Jul. 2, 1986

[51] Int. Cl.$^4$ .......................... B32B 3/00; H02B 1/00; H01B 7/34; H05K 3/34

[52] U.S. Cl. .................... 428/210; 428/209; 428/432; 428/901; 361/383; 29/840; 174/16 HJ

[58] Field of Search .................. 427/96; 361/383, 386, 361/400; 29/840; 174/68.5, 16 HJ; 428/209, 901, 210, 432

[56] References Cited

U.S. PATENT DOCUMENTS

| | | | |
|---|---|---|---|
| 4,318,954 | 3/1982 | Jensen | 428/209 |
| 4,385,202 | 5/1983 | Spinelli et al. | 174/68.5 |
| 4,546,406 | 10/1985 | Spinelli et al. | 361/386 |
| 4,570,337 | 2/1986 | Butt | 29/840 |
| 4,581,680 | 4/1986 | Garner | 361/403 |
| 4,590,095 | 5/1986 | Park | 427/96 |

OTHER PUBLICATIONS

IBM Tech. Disclosure Bulletin, T. O. Ledgwick, Mounting Technique for Solder Reflow Areal Array Mounted Silicon Chips which Allows Direct & Efficient Backside Heat Removal, vol. 20, No. 12, May, 1978, p. 5391.

Primary Examiner—John E. Kittle
Assistant Examiner—Patrick J. Ryan
Attorney, Agent, or Firm—Marvin Snyder; James C. Davis, Jr.

[57] ABSTRACT

A circuit board assembly for supporting a leadless ceramic chip carrier for surface mounting on a printed circuit board and for reducing the thermally induced stress on solder joint connections at the carrier-to-board contacts. The board includes an inner heat sink core comprising a highly conductive plate having openings provided therein in the areas which underlie the chip carrier. The openings have inserts therein of a material which closely matches the thermal coefficient of expansion of the ceramic to thereby reduce stress of the intermediate solder joints.

12 Claims, 2 Drawing Figures

CIRCUIT BOARD CONSTRUCTION

BACKGROUND OF THE INVENTION

This application relates generally to printed circuit board construction for supporting carrier mounted integrated circuit chips. More particularly, this application is directed to a particular circuit board construction for use in connection with leadless ceramic chip carriers intended for operation under severe environmental conditions and in which the thermal coefficient of expansion of the ceramic carrier is matched to that of the supporting board.

It is common practice to mount integrated circuit chips on various types of chip carriers to meet a variety of special requirements. These requirements include ease of mounting the carriers on circuit boards to form a more complex board assembly in a manner which is both convenient and inexpensive. The circuit board must also cooperate to adequately remove heat from the chip under severe thermal conditions which may be encountered in operation. Physical contacts between the various components of the assembly must permit expansion and contraction with temperature changes without causing excessive stresses at critical points in the assembly. The composite assemblies must, in addition, be light in weight, compact in size and be easily fabricated using known techniques.

Prior art printed circuit board assemblies typically comprise some combination of metals, plastic and ceramics, each of which compromises one aspect of functionality to emphasize another. For example, high electrical and thermal conductivity metals such as copper and aluminum, while essentially providing excellent heat removal characteristics, differ substantially from ceramics in thermal expansion. These metals thus cause thermal fatigue, undue stresses and premature failure at the intermediate interfaces such as at solder joints, etc. Other metals may be selected which better match the thermal characteristics of the ceramic but do not provide the same high degree of thermal sink properties, electrical conductivity, or are less easily fabricated to form the assembly. While plastics may provide easy fabrication into various configurations, they do not provide for sufficient heat removal, electrical connections or hermeticity. In short, while various combinations and types of materials such as plastics, metals and ceramics have been used to fabricate circuit board assemblies with specified functional characteristics, each of these materials has its drawbacks; no known combination is a panacea.

Where the circuit assembly is to meet the requirements of a demanding environment, ceramic chip carriers have been favored in use. In particular, such ceramic carrier arrangments are typically used or specified for military applications and for use in industrial computer and telecommunication applications, particularly where hermeticity is desired. Additionally, where high density surface mounting is mandatory chip carriers of the hermetically sealed leadless type are most frequently used. Such packages require thermally matched or controlled circuit mounting boards, as alluded to above. Specifically, either the temperature environment must be controlled within narrow specified limits or the components must be selected to avoid adverse effects attendant to stresses caused by large fluctuations in working condition temperatures.

One particular stress which must be addressed in such arrangements is the large thermal mismatch between the chip carrier's alumina body (with a thermal coefficient of expansion of approximately 6 ppm/°C.); a supporting copper thermal heat sink (with an approximate thermal coefficient of expansion of 17 ppm/°C.); and, for example, intermediately located laminates of various kinds with typical thermal coefficients of expansion in the approximate range of 3 to 14 ppm/°C.). These differences in the coefficients of thermal expansion of the ceramic carrier, underlying laminate and supporting heat sink core result in stresses at the electrical connections between the chip carrier leads or terminals on the body of the ceramic carrier and the conductive runs on the laminate which supports the package and elsewhere in the assembly.

There are three general solutions to the above discussed problem. The first is a board material that will nearly match the thermal coefficient of expansion of the alumina carrier. The second is to put leads on the ceramic carrier, but this adds expense to an already costly unit. A third is to replace the leadless ceramic carrier with a plastic leaded unit that contains some sort of humidity protection.

The military has concentrated its efforts on the first method, i.e., a construction which approximately matches the ceramic's thermal coefficient of expansion to that of the underlying structure. A popular method to accomplish this is to use sandwiched layers of either copper-Kevlar-copper, copper-molybdenum-copper, or epoxy-graphite as the inner core of the multilayer structure. This diminishes the problem of thermal expansion mismatch since the inner core's thermal characteristics dominate the composite thermal coefficient of expansion and match that of the carrier's ceramic. Another variation is to use rigid composites, such as polyimide reinforced Kevlar or quartz, to achieve the low thermal coefficient of expansion required. These materials have sufficiently low thermal coefficients of expansion to keep shear strains of the solder joint to a minimum. However, routing and drilling of quartz in Kevlar fabric-reinforced composites are extremely difficult. In addition, microcracking of the brittle polyimide matrix resulting from excessive radial expansion of Kevlar fibers has stalled the widespread acceptance of polyimide Kevlar. Accordingly, it would be desirable to provide a circuit board assembly which, in addition to meeting the previously mentioned function goals, also better matches the thermal expansion coefficient of a ceramic chip carrier to that of the underlying inner core support structure while concurrently maintaining or improving heat sink performance.

This application is, therefore, directed to an improvement in the above-noted technique of matching the thermal coefficient of expansion of the ceramic chip carrier body to that of the inner core of a multilayer structure. By varying the structure of the inner core, a better match with the thermal coefficient of expansion of the ceramic chip carrier is achieved, while concurrently providing a more efficient thermal heat sink.

OBJECTS AND SUMMARY OF THE INVENTION

A principal object of the invention therefore is to provide a new and improved printed circuit board assembly for leadless ceramic chip carriers.

Yet another object is to provide a printed circuit board assembly including a ceramic chip carrier supported on an inner highly heat conductive core, the core being formed by a highly thermally conductive plate having openings located immediately below the ceramic carrier, said opening having inserts therein of a material closely matching the thermal expansion characteristics of the ceramic.

A yet further object is to provide an inner heat sink core for a circuit board assembly structure which provides a better match to the thermal coefficient of expansion of a ceramic carrier while concurrently providing a better heat sink characteristic.

Yet another object is to provide a printed circuit board assembly of the above noted type which provides a high coefficient of thermal conductivity for more efficient cooling.

A still further object is to provide a printed circuit board assembly having the above features which is easily fabricated using conventional manufacturing techniques.

These and other objects of the invention are accomplished by the provision of a circuit board assembly for supporting a leadless ceramic chip carrier for surface mounting on a printed circuit board and for relieving the thermally produced stress on solder joint connections at the carrier contacts. The board includes an inner heat sink core comprising a highly conductive plate having openings provided therein in the areas which support the carrier. The openings have inserts therein of a material which closely matches the thermal coefficient of expansion of the ceramic to thereby reduce stress of the intermediate solder joints.

BRIEF DESCRIPTION OF THE DRAWINGS

While the specification concludes with claims defining the features of the invention that are regarded as novel, it is believed that the invention, together with further objects thereof, will be better understood from a consideration of the following description taken in conjunction with the drawings, in which:

DESCRIPTION OF THE PREFERRED EMBODIMENT

Figure 1:
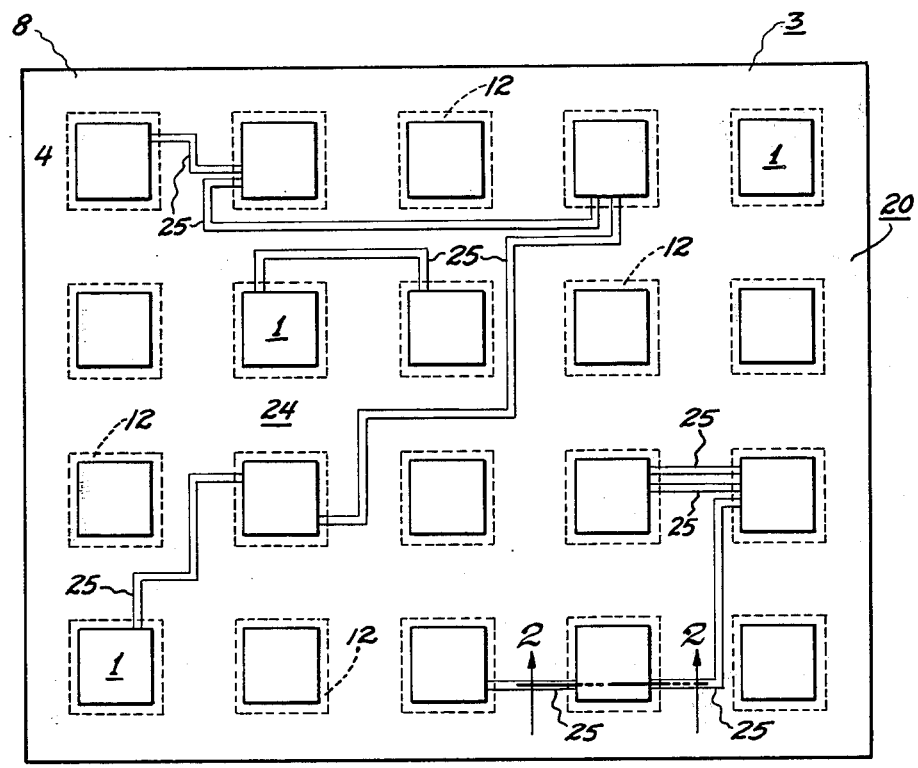
FIG. 1 is an illustrative plan view of a circuit board according to the invention.
Figure 2:
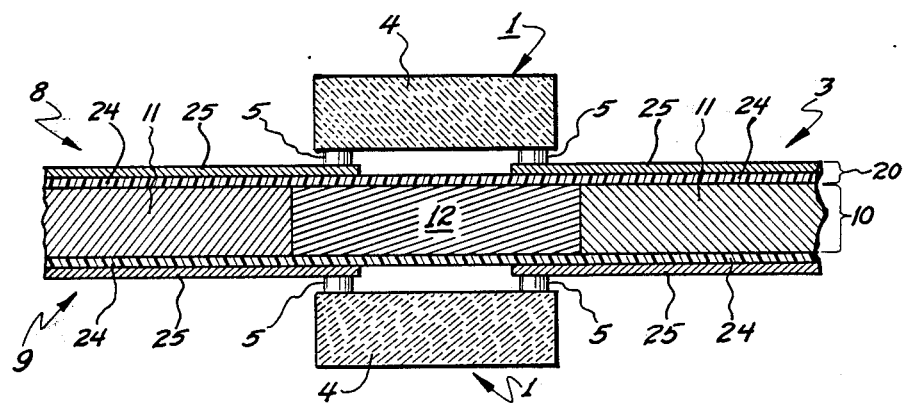
FIG. 2 is a cross sectional view taken along the lines 2—2 of FIG. 1 showing some details of the circuit board of the invention.

Referring now to FIGS. 1 and 2, there is shown the printed circuit board assembly of the invention which comprises a plurality of integrated circuit packages 1 supported on a circuit board 3. Chip packages 1 may be supported on either one or both sides of the circuit board 3.

The integrated circuit chip packages 1 are conventional in nature and are constructed according to one of several known commercial techniques. The packages 1 include an integrated chip (not shown) mounted within a chip carrier 4 electrical connection being made to the chip by means of conductive leads, terminals or pads 5 (FIG. 2) carried on or along one face of the carrier 4. The carrier 4 may be made of plastic ceramic or other known materials depending on the functional specification to be met by the circuit design.

The board 3 is formed with a generally flat, rectangular configuration having opposed sides 8 and 9. Either or both sides may provide a component mounting surface, as alluded to earlier, with FIG. 2 showing both sides being utilized for component mounting.

The circuit board 3 includes a generally rectangular, flat and rigid core 10, (FIG. 2), which comprises a highly thermally conductive plate 11 having a plurality of openings or voids therein containing inserts 12. The plate 11 is generally intended to act as a pathway to remove heat from the circuit package and, in addition, to provide an adequate degree of rigidity for support purposes. To this end the plate may be comprised typically of copper, aluminum or other metals of equivalent properties.

The openings in the plate 11 have mounted therein inserts 12 comprised of a material which closely matches the thermal coefficient of expansion of the carrier 4, for reasons which will be explained in greater detail hereinafter. While the inserts and openings as shown in the drawings are generally square in shape, they may take a variety of forms, such as circular or rectangular so long as their shapes are complementary. Any of several easily fabricated shapes may suffice. The thicknesses of the plate 11 and inserts 12 are substantially the same so as to provide a generally planar upper and lower surface on each side of the inner core 10. In the case where the carrier 4 is made of ceramic material, the inserts may be made of Invar, a commercially avaiable alloy of nickel, iron and cobalt of other suitable alloy whose coefficient of thermal expansion is in the approximate range of 6 ppm/°C. The inserts 12 are generally located juxtaposed from or directly under the ceramic chip carriers 4 and extend a small distance beyond the outer extent of the terminals 5 as shown by the dotted lines in FIG. 1.

A laminate 20 comprised of a thin insulative layer 24 and a thin layer of patterned conductive strips 25 is carried on opposite sides of the inner core 10. The laminate may conventionally comprise a layer 24 of polyimide and layer 25 of etched copper.

The layers 24 and 25 are as thin as practical given the insulating and conduction requirements of the circuit and in any event are substantially thinner than the inner core materials 11 and 12. Typically, the laminate is on the order of 5 mils thick, while the core 10 is at least 6–10 times thicker, typically in the range of from 30–50 mils. The conductive strips 16 in a conventional manner extend into contiguous relationship with contacts 5 extending from the carrier 4. The laminate serves in a conventional manner as the electrical intercoupling or interconnection vehicle for the circuit assembly. Specifically, the laminate interconnection scheme permits different integrated circuit packages carried on the board assembly to be coupled to each other (and to elements outside the board) as desired to achieve a functional result. Only a few of the many required conductive strips 25 are shown in FIG. 1 for eas of illustration. In an actual embodiment many more strips would typically be required to accomplish the needed interconnections.

While the laminate 20 has been shown in FIG. 2 as consisting of a single layer of insulator coated with a single layer of conductive strip, in practice a multilayer laminate is common in order to provide several layers of interconnecting strips for more complex circuit assemblies. Any one of several techniques may be employed to achieve electrical connection between the terminals 5 and their associated conductive strips 25, the use of a solder joint being the most common of the techniques.

One of the major problems associated with circuit board assemblies of the type disclosed herein results from the thermal expansion mismatch between components. This mismatch is amplified by the use of relatively large substrates and chip carriers or surface mount device packaging. Specifically, as the temperture changes the ceramic chip carrier changes dimension at a different rate than the underlying components resulting in stress or shear strains on the solder joint or other electrical connections between the terminals 5 on the carrier and the conductive runs 25 on the interconnecting laminate.

As alluded to previously, the major prior art solution to this problem is to employ a thin laminate mounted on an inner core comprising a thin layer of copper deposited on a relatively thick continuous plate of a material (usually Invar or molybdenum) which matches the coefficient of thermal expansion of the ceramic. Since the Invar or molybdenum plate is relatively massive as contrasted with the other intermediate components its thermal expansion characteristics dominate the reaction of the supporting structure and thereby provide a reasonably good match to the ceramic.

In cases where both sides of the circuit board are to operate as mounting surfaces, a sandwich construction of copper-Invar-copper or copper-molybdenum-copper, according to the above construction is employed with a similar result. The key to this prior art approach is the good match between the thermal expansion characteristics of the ceramic or other chip carrier and the underlying inner core of Invar or other suitable thermally matched material, along with the thermal transparency of the intermediate layers.

The construction of the invention as shown in FIGS. 1 and 2 departs from the prior art by firstly providing a more massive, plate-like configuration for the highly conductive heat sink-support component of the inner core. Secondly, the thermal matching component of the inner core, instead of being continuous across the breadth of the assembly is instead used in the form of discrete pads or inserts tailored to the shape and location of the chip carriers. This construction provides several advantages over the above-noted prior art approach. Firstly, by using the inserts only under or juxtaposed to the chip carrier bodies, a saving in relatively expensive results, without any sacrifice in performance characteristics with respect to thermal stress. Moreover, since the inner core includes a copper plate having a greater thickness and mass than used in the prior art construction, an increase in heat dissipation results, thereby enabling operation in a more severe environment than previously possible using the prior art approach.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An integrated circuit board assembly comprising:
    a leadless integrated circuit chip carrier;
    a plurality of conductive terminals associated with said carrier and extending along one face of said carrier;
    a printed circuit laminate including a plurality of contact strips, said strips electrically coupled to said terminals via electrical connections; and
    an inner core on which said laminate is supported, said core including a highly thermally conductive plate having openings therein, said openings located juxtaposed to said one face of said chip carrier and containing inserts having a thermal coefficient of expansion closely matching that of said carrier.

2. The combination recited in claim 1 wherein said carrier is selected from the group comprising plastics, metals and ceramics.

3. The combination recited in claim 1 wherein the thickness of said laminate is small relative to the thickness of said core.

4. The combination recited in claim 1 wherein said laminate includes alternate layers of copper and polyimide.

5. The combination recited in claim 1 wherein said electrical connections comprise solder joints.

6. The combination recited in claim 1 wherein said carrier is made of a ceramic material and forms a hermetically sealed package.

7. A circuit board comprising:
    a highly conductive metal plate, said plate having a plurality of openings therein;
    a plurality of metal inserts mounted in said openings, the surfaces of said inserts being substantially flush with the surfaces of said plate to form a planar mounting surface;
    an insulating layer carried on said mounting surface;
    an integrated chip carrier mounted on said insulating layer, said layer having deposited thereon conductive strips electrically coupled to conductive portions of said chip carrier, said carrier being supported juxtaposed to one of said inserts, said inserts being made of a material having a coefficient of thermal expansion closely matching the coefficient of thermal expansion of said carrier.

8. The combination recited in claim 7 wherein said plate is copper.

9. The combination recited in claim 7 wherein said layer comprises a polyimide.

10. The combination recited in claim 8 wherein said carrier is made of a ceramic material and said inserts are made of an alloy of nickel, iron and cobalt.

11. The combination recited in claim 8 wherein said inserts are locked directly opposite the areas of contact between said conductive portions of said chip carrier and said conductive strips.

12. The combination recited in claim 1 wherein said carrier is made of a ceramic material, said inner core is made of copper, and said inserts are located directly opposite said electrical connections.

* * * * *